United States Patent [19]

Altimari et al.

[11] Patent Number: 6,159,817
[45] Date of Patent: Dec. 12, 2000

[54] MULTI-TAP THIN FILM INDUCTOR

[75] Inventors: Robert J. Altimari, Coventry; Jean D. Madden, Jr., Warwick; Edward R. Maynard, Greene; William E. Pitts, West Warwick, all of R.I.

[73] Assignee: Electro-Films Incorporated, Warwick, R.I.

[21] Appl. No.: 09/074,185

[22] Filed: May 7, 1998

[51] Int. Cl.[7] ............................................. H01L 21/20
[52] U.S. Cl. .................................... 438/381; 438/238
[58] Field of Search ........................... 438/190, 210, 438/238, 329, 381, FOR 220; 257/277, 531, FOR 531

[56] References Cited

U.S. PATENT DOCUMENTS

| | | | |
|---|---|---|---|
| 3,553,533 | 1/1971 | Haberecht | 361/783 |
| 4,253,079 | 2/1981 | Brosh | 336/84 C |
| 4,297,647 | 10/1981 | Akiyama et al. | 330/307 |
| 4,755,783 | 7/1988 | Fleischer et al. | 336/84 |
| 4,783,722 | 11/1988 | Osaki et al. | 361/411 |
| 4,827,328 | 5/1989 | Ozawa et al. | 357/80 |
| 4,881,050 | 11/1989 | Swanson, Jr. et al. | 333/185 |
| 5,134,400 | 7/1992 | Hash | 341/136 |
| 5,170,146 | 12/1992 | Gardner et al. | 338/313 |
| 5,176,853 | 1/1993 | Sarma et al. | 252/512 |
| 5,177,670 | 1/1993 | Shinohara et al. | 361/388 |
| 5,202,655 | 4/1993 | Hara | 333/215 |
| 5,231,078 | 7/1993 | Riebman et al. | 505/1 |
| 5,563,572 | 10/1996 | Hetzler | 338/254 |
| 5,572,180 | 11/1996 | Huang et al. | 336/200 |
| 5,604,383 | 2/1997 | Matsuzaki | 257/778 |
| 5,604,658 | 2/1997 | Pedder | 361/277 |
| 5,605,615 | 2/1997 | Goolsby et al. | 205/83 |
| 5,611,008 | 3/1997 | Yap | 385/14 |
| 5,629,553 | 5/1997 | Ikeda et al. | 257/531 |
| 5,635,761 | 6/1997 | Cao et al. | 257/700 |

FOREIGN PATENT DOCUMENTS 3-280512   12/1991   Japan .

*Primary Examiner*—Carl Whitehead, Jr.
*Assistant Examiner*—Jeff Vockrodt
*Attorney, Agent, or Firm*—Weingarten, Schurgin, Gagnebin & Hayes LLP

[57] ABSTRACT

A thin film spiral inductor is formed on a ceramic or other suitable substrate in a manner which facilitates adjustment of the inductive value of the inductor after its fabrication on the substrate. The thin film inductor comprises a spiral conductive path having a plurality of conductive pads connected at different positions about the periphery of the spiral path. A conductive pad is also located at the center of the spiral path in electrical connection to the inner end of the path. The center pad and a selected one of the peripheral pads serve as terminals of the inductor to provide an intended value of inductance. The unused pads may be severed from the spiral such as by a laser cut before connection of the inductor into a circuit

5 Claims, 1 Drawing Sheet

MULTI-TAP THIN FILM INDUCTOR

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

This invention relates to thin film circuits and more particularly to thin film inductors.

In the fabrication of microcircuits such as multi-chip modules having inductors, it is usually required to adjust the inductance value of the inductor to achieve an intended value. Such adjustment has been difficult to achieve by conventional techniques and have added to the complexity and cost of overall circuit fabrication.

One form of inductor is the wire wound inductor having a magnetic core and which can be positioned with respect to the surrounding inductor coils to achieve a desired value of inductance. Such wire wound inductors are relatively large and consume a significant portion of the available real estate of the module. Thin film inductors are also known and can be adjusted by laser trimming; however, the range of adjustability is limited usually to fine adjustment of the precise intended value of inductance.

BRIEF SUMMARY OF THE INVENTION

In accordance with the invention, a thin film spiral inductor is formed on a ceramic or other suitable substrate in a manner which facilitates adjustment of the inductive value of the inductor after its fabrication on the substrate. The thin film inductor comprises a spiral conductive path having a plurality of conductive pads connected at different positions about the periphery of the spiral path. A conductive pad is also located at the center of the spiral path in electrical connection to the inner end of the path. The center pad and a selected one of the peripheral pads serve as terminals of the inductor and provide an intended value of inductance. The unused pads may be severed from the spiral such as by a laser cut before connection of the inductor into a circuit. Each inductor is typically formed on a separate substrate which may be connected to an associated circuit by known techniques such as surface mounting, wire bonding or flip chip attachment.

The substrate is typically a ceramic material or an insulating layer such as silicon oxide on a silicon substrate. The conductive path forming the spiral inductor is applied using known thin film techniques.

DETAILED DESCRIPTION OF THE INVENTION

The figures illustrate the novel inductor in greatly exaggerated form. In an actual embodiment, the substrate 10 is about 0.05 inches square. The conductive path 12 typically has a 1 mil. line width and line spacing between turns. This embodiment has a maximum inductance between pads 16 and 18a of about 35 nano-henries.

Figure 1:
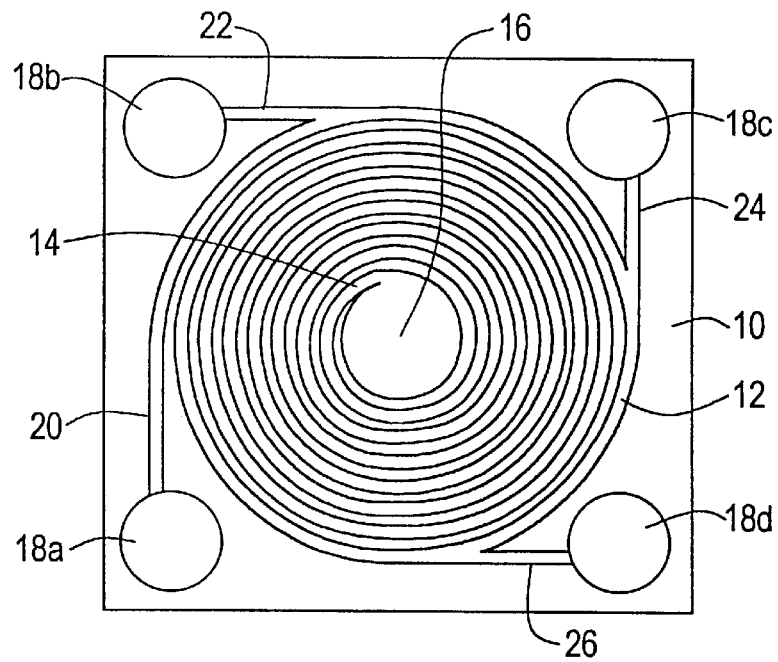
FIG. 1 is a plan view of a thin film inductor in accordance with the invention.

Referring to FIG. 1 there is shown a substrate 10 having formed on a surface thereof a conductive path 12 of spiral shape having an inner end 14 connected to an inner contact pad 16. A plurality of outer contact pads 18a–18d are provided about the periphery of the spiral path, each of these outer pads being connected by an interconnecting path to a respective portion of the periphery of the spiral path. Thus, pad 18a is connected by a conductive path section 20 to the outer end of the spiral path. Conductive pad 18b is connected to a second portion of the spiral path periphery by conductive section 22. Conductive pad 18c is connected to another portion of the spiral periphery by connecting section 24, and conductive pad 18d is connected to yet another portion of the spiral periphery by interconnecting section 26. In the illustrated embodiment four outer pads are illustrated, each connected to the spiral path at positions which are approximately 90° spaced from the adjacent pads.

The substrate is of an electrically insulating material typically ceramic or can be of a material having an electrically insulating surface coating such as a silicon oxide layer formed on a silicon substrate material. The spiral conductive path is typically formed of copper or gold, as are the pad areas. The pad areas may be solder coated.

The inductor is connected to an associated circuit using the inner pad 16 and one of the outer pads 18a–18d to provide the intended value of inductance. The maximum inductive value is provided by use of the inner pad 16 and outer pad 18a. Use of pad 18b and inner pad 16 provides an inductance value of about 90% of the maximum value. Use of the inner pad 16 and outer pad 18c provides a value of about 85% of the maximum value. Use of the inner pad 16 and outer pad 18d provides a value of about 75% of the total value.

The invention is not to be limited to the four outer pads or taps shown in FIG. 1. Different numbers of outer pads may be provided in other embodiments to provide intended levels of adjustment of inductance value to suit user requirements.

Figure 2:
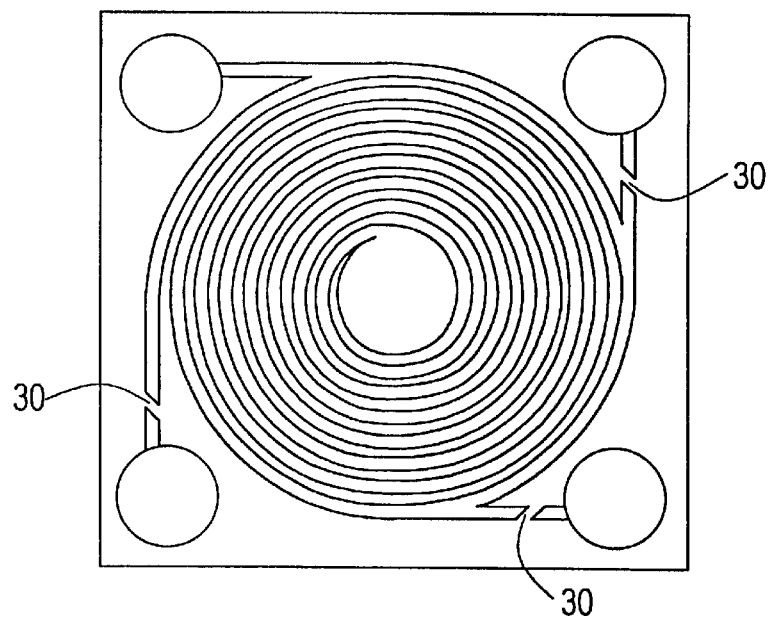
FIG. 2 is a plan view of the inductor of FIG. 1 illustrating severed unused terminal pads.

The unused outer pads may be severed from the spiral path as shown in FIG. 2 to remove these pads and interconnecting conductive path from the inductor in order to minimize stray inductance. As shown in FIG. 2, pads 18a, 18c and 18d have been severed at respective points 30 from the spiral path. Conductive pad 18b and inner pad 16 are the operative terminal pads in this illustrated embodiment.

Figure 3:
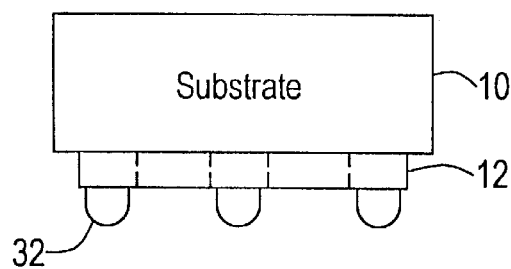
FIG. 3 is an elevation view of one embodiment of an inductor in accordance with the invention having solder bumps.

The inductor is formed on the substrate using known thin film circuit fabrication techniques. Usually an array of inductors is formed on a relatively large substrate, and the substrate is then subdivided into individual dies each of which contains a single inductor with its associated conductive pads, such as shown in FIG. 1. In general, the substrate surface is prepared using standard surface cleaning and preparation techniques, and a spiral conductive pattern and conductive pad areas is formed using well known photoresist and etching steps. The terminal pads may be solder plated depending upon the method of die attachment of the inductor into a final circuit. The inductor may be connected to an associated circuit by wire bonding of the terminal pads to associated terminal pads or terminal areas of the associated circuit. Alternatively, as shown in FIG. 3, the die can have solder bumps 32 provided on the terminal pads for flip chip attachment of the inductor to an associated circuit.

Fine adjustment of the inductance value can be accomplished using known laser trimming techniques. Various modifications and alternative implementations of the invention can be made without departing from the spirit and true scope of the invention. The invention is not to be limited by what has been particularly shown and described except as indicated in the appended claims.

What is claimed is:

1. A method of fabricating a thin film inductor comprising the steps of:

provideing a substrate having an electrically insulating surface;

forming a thin film spiral conductive path on the electrically insulating surface of the substrate;

forming a first conductive pad on the surface of the substrate at the inner end of the spiral and in electrical connection with the inner end of the spiral;

forming a plurality of second conductive pads at respective positions about the periphery of the conductive path and in electrical connection with respective different portions of the conductive path; and severing all of the plurality of second conductive paths except one so that only one of the second conductive pads is in electrical connection with the conductive path.

2. The method of claim 1 wherein the thin film spiral conductive path has a width approximately equal to the spacing between turns of the inductor.

3. The method of claim 1 wherein the thin film spiral conductive path and the first conductive pad and plurality of second conductive pads are integrally formed of a metal.

4. The method of claim 1 wherein the substrate is ceramic and wherein the conductive path and the first conductive pad and plurality of second conductive pads are copper.

5. The method of claim 1 wherein the first conductive pad and plurality of second conductive pads are solder coated.

* * * * *